US011095274B1

(12) United States Patent
Baksh et al.

(10) Patent No.: US 11,095,274 B1
(45) Date of Patent: Aug. 17, 2021

(54) PRE-DISCHARGED BYPASS FLIP-FLOP CIRCUIT

(71) Applicant: ADVANCED MICRO DEVICES, INC., Santa Clara, CA (US)

(72) Inventors: Nur Mohammad Baksh, Austin, TX (US); Michael Q. Co, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 17/032,530

(22) Filed: Sep. 25, 2020

(51) Int. Cl.
  *H03K 3/0233* (2006.01)
  *H03K 3/037* (2006.01)
  *H03K 3/3562* (2006.01)

(52) U.S. Cl.
  CPC ....... *H03K 3/0372* (2013.01); *H03K 3/02332* (2013.01); *H03K 3/3562* (2013.01)

(58) Field of Classification Search
  CPC ............. H03K 3/02332; H03K 3/0372; H03K 3/3562; H03K 3/35625
  See application file for complete search history.

(56) References Cited

U.S. PATENT DOCUMENTS 9,606,177 B2 * 3/2017 Bailey .............. G01R 31/31727
9,680,450 B2 * 6/2017 Bailey .............. H03K 3/356173

* cited by examiner

*Primary Examiner* — Patrick O Neill

(57) ABSTRACT

A pre-discharged edge-triggered flip-flop, in which internal nodes determinative of an output signal are discharged to VSS prior to an evaluation phase of a clock signal, is provided to enable improved clock-to-output response times when provided with a rising edge of a clock pulse. In operation, during a pre-discharge phase of the clock signal, multiple internal nodes of a differential master latch circuit of the flip-flop are discharged to VSS. In response to a rising edge of the clock signal signaling the beginning of an evaluation phase, one of the internal nodes (selected depending on the logical value of an input signal to the flip-flop) is charged to VDD while other of the internal nodes remain at VSS. A single clock signal inverter is disposed between the input clock signal and a multiplexer providing the output data signal.

18 Claims, 5 Drawing Sheets

PRE-DISCHARGED BYPASS FLIP-FLOP CIRCUIT

BACKGROUND

A flip-flop circuit (or simply "flip-flop") is used as a building block of a variety of sequential logic circuits such as registers. For example, many modern microprocessors use a technique known as pipelining in which the processing of an instruction is broken down into several smaller sub-tasks, each of which can be performed within one clock cycle. Pipelined microprocessors include dedicated circuitry to perform each sub-task, and different instructions are processed at each subtask in a sequential, or pipelined fashion. By using this technique, pipelined microprocessors are able to achieve high effective instruction throughput even though only a portion of any individual instruction is processed per clock cycle in one of the pipeline stages.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
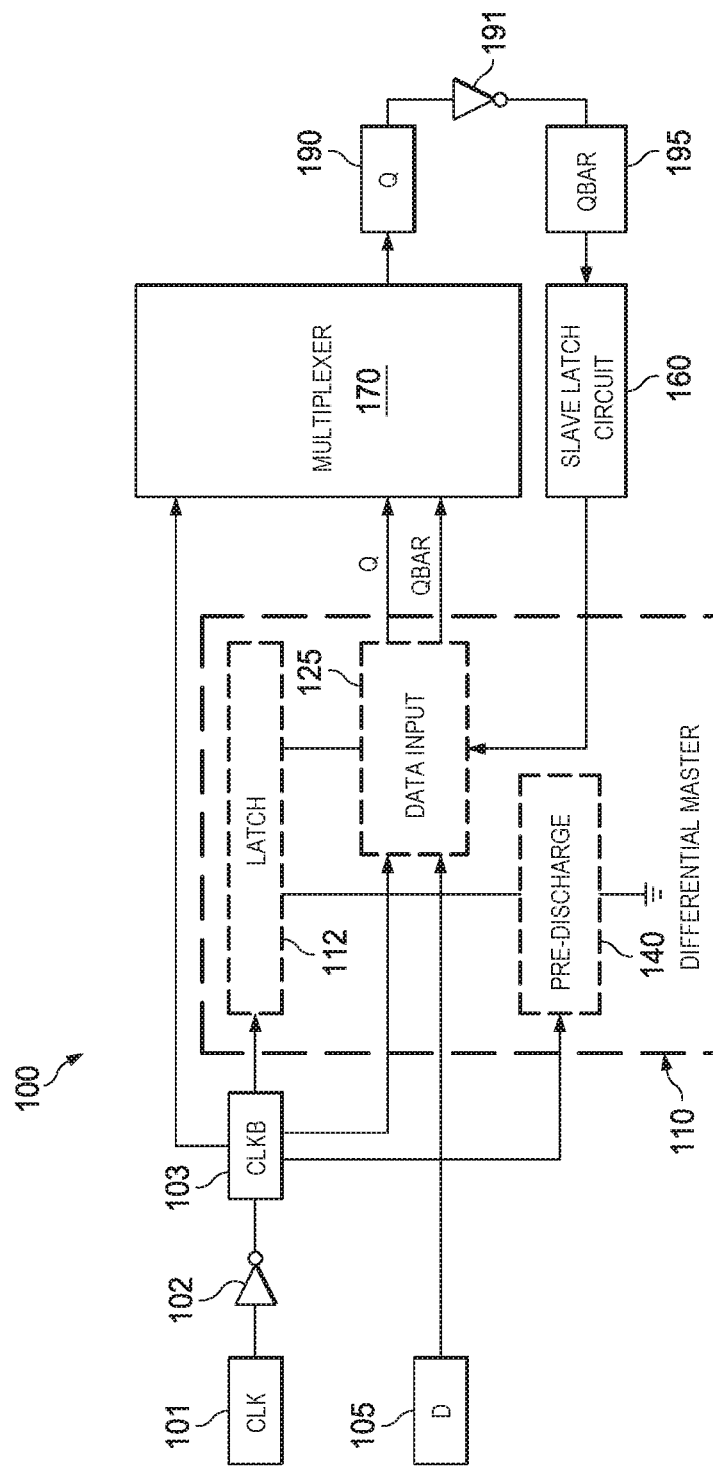
FIG. 1 is a block diagram of a pre-discharged edge-triggered flip-flop in accordance with some embodiments.

Techniques described herein are generally directed to embodiments of a pre-discharged edge-triggered flip-flop (in which internal nodes determinative of an output signal are discharged to VSS prior to an evaluation phase of a clock signal) that enables improved clock-to-output response times when provided with a rising edge of a clock pulse. In certain embodiments, such improvements to clock-to-output rising edge response times may be partially associated with utilizing only a single inverter within a clock timing path of the flip-flop. In contrast, previous attempts to design a flip-flop circuit with reduced clock-to-output rising edge response times have typically utilized two or more such inverters within the relevant clock timing path.

Pipelined microprocessors use pipeline registers to store the results of an operation at a particular pipeline stage and provide these results to a subsequent pipeline stage. The speed of a pipelined microprocessor is limited by the amount of time it takes to perform the functions of a pipeline stage, as well as to stably store the results in one or more corresponding pipeline registers. Thus, the speed at which the microprocessor clock may operate is limited, in part, by the delay through the pipeline register, and hence a clock-to-output response time of the flip-flops that make up the pipeline register.

In various circuit applications, the design of critical or even non-critical timing paths may distinguish between timing paths (or portions thereof) for which it is advantageous to decrease the rising edge clock-to-output time (the delay in response to a rising edge of a clock pulse), and other timing paths (or portions thereof) for which it is advantageous to decrease the falling edge clock-to-output time (the delay in response to a falling edge of a clock pulse). Examples of various flip-flop circuit designs associated with superior clock-to-output falling edge response times are described in U.S. Patent Application 2016/0248405 entitled "Flip-Flop Circuit with Latch Bypass," which is hereby incorporated by reference in its entirety.

In practice, embodiments of a pre-discharged flip-flop circuit in accordance with the present disclosure, which are generally associated with improved clock-to-output rising edge response times, may be utilized in conjunction with other flip-flop designs (such as those associated with improved clock-to-output falling edge response times) in order to reduce overall delays associated with one or more timing paths in a pipelined microprocessor or other integrated circuit. In this manner, such overall delays may be reduced without, as non-limiting examples, altering a polarity of one or more portions of those timing paths or utilizing logic gates that are selected to be skewed towards a particular type (rising edge or falling edge) of clock pulse response. Consequently, various embodiments allow operation of an associated integrated circuit at higher maximum clock frequencies while reducing design complexity of that integrated circuit.

As used herein, the clock-to-output response time (also termed clock-to-Q response time or clk2q delay) of a flip-flop refers to the length of time between the edge of a clock pulse (either a rising or falling edge) and the corresponding provision of an appropriate output signal, such as an output signal corresponding to the value of an input signal provided to the flip-flop.

FIG. 1 is a block diagram of an embodiment of a pre-discharged edge-triggered flip-flop 100 that includes a differential master latch circuit 110 and a multiplexer 170, each of which receives an inverted clock signal 103 via clock signal 101 and inverter 102, as well as a slave latch circuit 160.

The differential master latch circuit 110 includes a latch portion 112, data input portion 125, and pre-discharge portion 140. Latch portion 112 receives inverted clock signal CLKB and is connected to data input portion 125 and pre-discharge portion 140. Data input portion 125 receives the inverted clock signal CLKB and a data input signal "D" 105, provides selective outputs to multiplexer 170, and is connected to both latch portion 112 and slave latch circuit 160. Pre-discharge portion 140 receives inverted clock signal CLKB, and is connected to latch portion 112.

The multiplexer 160 receives inverted clock signal CLKB and selective outputs of data signal Q and inverted data signal QBAR, and provides output data signal Q 190. The slave latch circuit 160 receives inverted data output signal QBAR 195 via inverter 191, and is connected to data input portion 125.

In operation of the embodiment of FIG. 1, during the logical low phase of the clock signal CLK (referred to herein as the pre-discharge phase), internal nodes of latch portion 112 of the differential master latch circuit 110 are discharged to VSS via pre-discharge portion 140. In response to a rising edge of the clock signal CLK (which signals the beginning of the evaluation phase of the clock signal), one of those internal nodes (depending on the logical value of input signal D 105) is 'pulled up' to VDD while the other of those internal nodes remains at VSS. For example, if the input signal D 105 rises from a logical low state to a logical high state, then one of those internal nodes remains low, causing output data signal Q to transition high in response to a falling inverted clock signal CLKB 103. Alternatively, if the input signal D 105 falls from a logical high state to a logical low state, then the other of those internal nodes remains low, causing the output data signal Q to transition low in response to that falling inverted clock signal CLKB 103. It will be appreciated that the pre-discharged state of such internal nodes consequently results in the flip-flop 200 having a lower clock-to-output rising edge response time than the corresponding clock-to-output falling edge response time. Notably, in the depicted embodiment such operations are performed via the use of a single clock signal inverter 102 disposed between clock signal CLK 101 and the output data signal Q, as depicted by the path from the clock signal 101 to inverter 102 and then to multiplexer 170.

Additional details of differential master latch circuit 110, latch portion 112, data input portion 125, pre-discharge portion 140, slave latch circuit 160 and multiplexer 170 are discussed below with respect to FIG. 2.

Figure 2A:
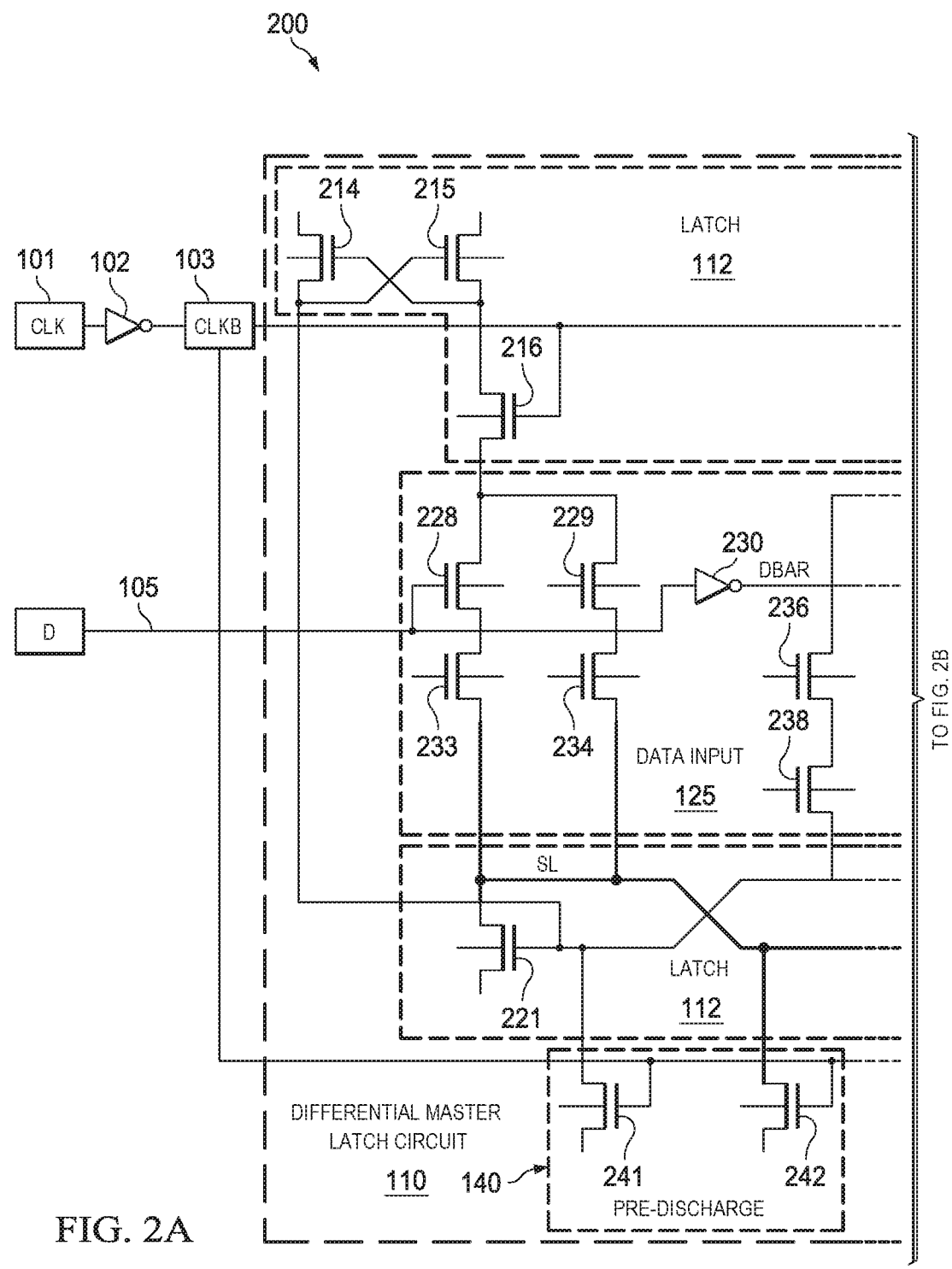
FIGS. 2A-2B illustrate in partial logic diagram and partial schematic form an embodiment of a flip-flop 200 in accordance with some embodiments.
Figure 2B:
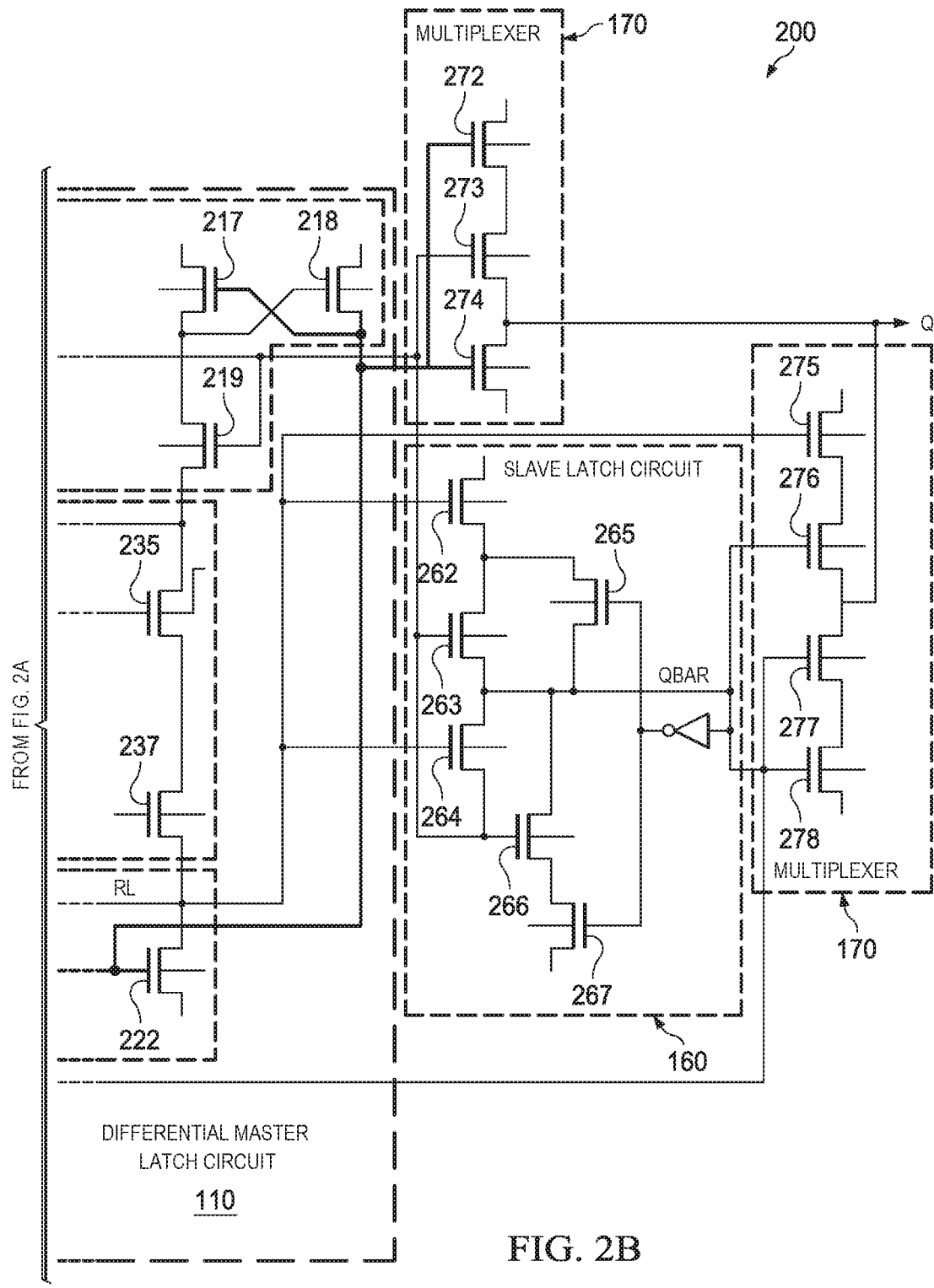

FIGS. 2A-2B illustrate in partial logic diagram and partial schematic form an embodiment of an asymmetric pre-discharged flip-flop 200 that includes a differential master latch circuit 110, a slave latch circuit 160, and a multiplexer 170. An inverted clock signal CLKB is provided to the differential master latch circuit 110 via clock signal 101 and clock inverter 102. Data input signal "D" 105 is also provided to the differential master latch circuit 110.

Differential master latch circuit 110 includes a latch portion 112, a data input portion 125, and a pre-discharge portion 140. In the depicted embodiment, latch portion 112 includes P-channel metal-oxide-semi-conductor (PMOS) transistors 214-219, and N-channel metal-oxide-semi-conductor (NMOS) transistors 221-222. Transistor 214 has a source connected to VDD, a drain connected to node RL, and a gate connected to the drain of transistor 215. Transistor 215 has a source connected to VDD, a drain connected to the gate of transistor 214, and a gate connected to node RL. Transistor 216 has a source connected to the drain of transistor 215 and the gate of transistor 214, a gate connected to inverted clock signal CLKB, and a drain connected to data input portion 125 via the drain of transistor 228. Transistor 217 has a source connected to VDD, a drain connected to the gate of transistor 218 and the source of transistor 219, and a gate connected to node SL. Transistor 218 has a source connected to VDD, a drain connected to node SL, and a gate connected to the drain of transistor 217 and the source of transistor 219. Transistor 219 has a source connected to the drain of transistor 217 and the gate of transistor 218, a gate connected to inverted clock signal CLKB, and a drain connected to data input portion 125 via an inverted data input signal DBAR provided by inverter 230. Transistor 221 has a drain connected to node SL, a source connected to VSS, and a gate connected to node RL. Transistor 222 has a drain connected to node RL, a source connected to VSS, and a gate connected to node SL.

The data input portion 125 includes P-channel transistors 228 and 229, an inverter 230, and P-channel transistors 233-238. Transistor 228 has a source connected to latch portion 112 (via the drain of transistor 216) and to the source of transistor 229, a drain connected to the source of transistor 233, and a gate connected to data input signal D. Transistor 229 has a source connected to the source of transistor 228 and the drain of transistor 216, and a drain connected to the source of transistor 233. Transistor 233 has a source connected to the drain of transistor 229 and a drain connected to node SL. Transistor 234 has a source connected to the source of transistor 229 and a drain connected to node SL. Transistor 235 has a source and gate that are each connected to the inverted data input signal DBAR via inverter 230, and a drain that is connected to the source of transistor 237. Transistor 236 has a source connected to the inverted data input signal DBAR, and a drain connected to the source of transistor 238. Transistor 237 has a source connected to the drain of transistor 235, and a drain connected to node RL. Transistor 238 has a source connected to the drain of transistor 236 and a drain connected to node RL.

Pre-discharge portion 140 includes N-channel transistors 241 and 242. Transistor 241 has a drain connected to node RL, a gate connected to inverted clock signal CLKB, and a source connected to VSS. Transistor 242 has a drain connected to node SL, a gate connected to inverted clock signal CLKB, and a source connected to VSS.

Also in the embodiment of FIGS. 2A-2B, slave latch circuit 160 includes P-channel transistors 262, 263 and 265; inverter 269; and N-channel transistors 264, 266 and 267. Transistor 262 has a source connected to VDD, a gate connected to node RL, and a drain connected to the source of transistor 263 and the drain of transistor 265. Transistor 263 has a source connected to the drains of transistor 262 and transistor 265, a drain connected to node QBAR (the complement of output data signal Q), and a gate connected to inverted clock signal CLKB. Transistor 264 has a drain connected to node QBAR, a source connected to VSS, and a gate connected to node RL. Transistor 265 has a drain connected to the drain of transistor 262 and the source of transistor 263, a source connected to node QBAR, and a gate connected to data signal Q via inverter 269. Transistor 266 has a drain connected to node QBAR, a source connected to the source of transistor 267, and a gate connected to inverted clock signal CLKB. Transistor 267 has a source connected to the source of transistor 266, a drain connected to VSS, and a gate connected to data signal Q via inverter 269.

Continuing with the embodiment of FIGS. 2A-2B, multiplexer 170 includes N-channel transistors 274 and 277-278, and P-channel transistors 272-273 and 275-276. Transistor 272 has a source connected to VDD, a drain connected to the source of transistor 273, and a gate connected to node SL. Transistor 273 has a source connected to the drain of transistor 272, a drain connected to output data signal Q, and a gate connected to inverted clock signal CLKB. Transistor 274 has a drain connected to output data signal Q, a source connected to VSS, and a gate connected to inverted clock signal CLKB. Transistor 275 has a source connected to VDD, a drain connected to the drain of transistor 276, and a gate connected to node RL. Transistor 276 has a drain connected to the drain of transistor 275, a source connected to output data signal Q, and a gate connected to node QBAR. Transistor 277 has a drain connected to output data signal Q, a source connected to the drain of transistor 278, and a gate connected to inverted clock signal CLKB. Transistor 278 has a drain connected to the source of transistor 277, a source connected to VSS, and a gate connected to node QBAR.

In operation of the embodiment of FIGS. 2A-2B, during the logical low phase of the clock signal CLK (the pre-discharge phase), nodes SL and RL, internal to latch portion 112 of the differential master latch circuit 110, are discharged to VSS via transistors 241 and 242 of pre-discharge portion 140. In response to a rising edge of the clock signal CLK (which signals the beginning of the evaluation phase of the clock signal), one of those nodes SL and RL (depending on the logical value of input signal D 105) is 'pulled up' to VDD while the other of those internal nodes remains at VSS.

For example, if the input signal D 105 rises from a logical low state to a logical high state, then node SL remains low, causing output data signal Q to transition high in response to a falling inverted clock signal CLKB 103. Alternatively, if the input signal D 105 falls from a logical high state to a logical low state, then node RL remains low, causing the output data signal Q to transition low in response to that falling inverted clock signal CLKB 103. It will be appreciated that the pre-discharged state of internal nodes SL and RL consequently results in the flip-flop 200 having a lower clock-to-output rising edge response time than the corresponding clock-to-output falling edge response time. As in the embodiment of FIG. 1, in the depicted embodiment such operations are performed via the use of a single clock signal inverter 102 disposed between clock signal CLK 101 and the output data signal Q.

Figure 3:
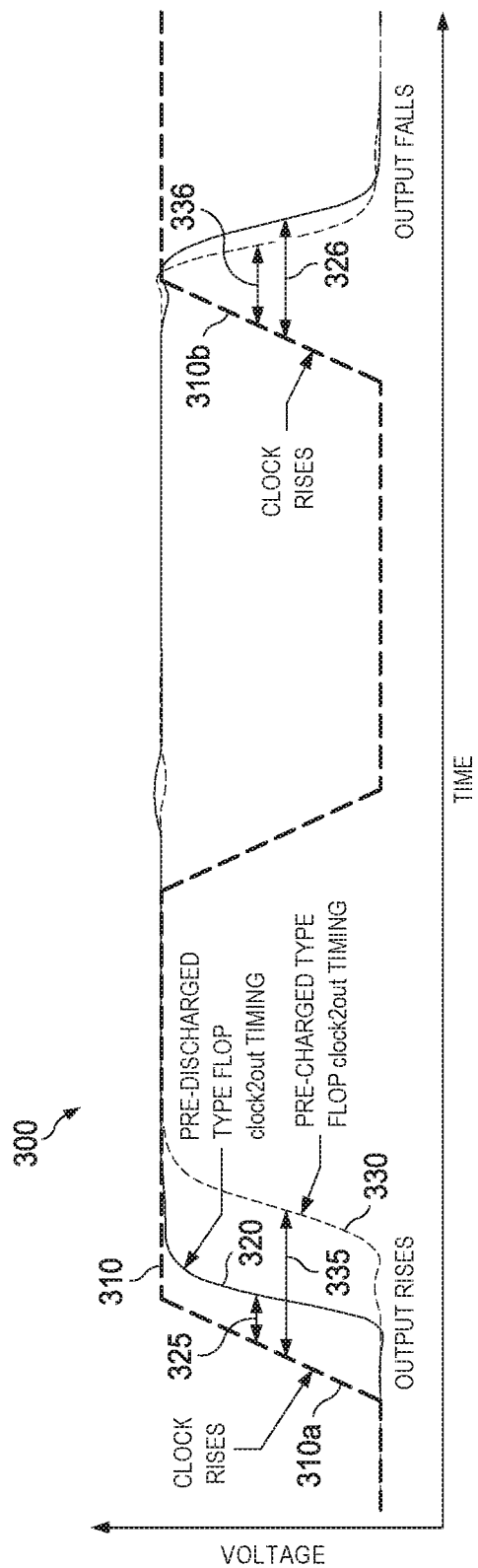
FIG. 3 presents a timing diagram illustrating rising edge response times associated with a pre-discharged type flip-flop in accordance with some embodiments.

FIG. 3 presents a timing diagram illustrating a comparison between rising edge response times associated with a pre-discharged type flip-flop in accordance with the present disclosure and corresponding rising edge response times associated with a pre-charged type flip-flop. In particular, FIG. 3 illustrates voltage levels for a clock signal 310 (such as may be provided by clock signal 101 of FIGS. 1-2) having a first rising edge 310a and a second rising edge 310b, response timing 320 associated with a pre-discharged type flip-flop in accordance with the present disclosure as an output signal of the pre-discharged flip-flop rises from a logical low state to a logical high state, and response timing 330 associated with a pre-charged type flip-flop as its output signal similarly rises from a logical low state to a logical high state.

Time span 325 illustrates the response time of the pre-discharged type flip-flop as its output signal rises from a logical low state to a logical high state; comparatively, time span 335 illustrates the response time of the pre-charged type flip-flop as its output signal similarly rises from the logical low state to the logical high state. In the illustrated example, the time span 325 approximates only 37% of the time span 335, indicating an improved rising edge response time of the pre-discharged type flip-flop.

Time span 326 illustrates the response time of the pre-discharged type flip-flop as its output signal falls from a logical high state to a logical low state; comparatively, time span 336 illustrates the response time of the pre-charged type flip-flop as its output signal similarly falls from the logical high state to the logical low state. In the illustrated example, the time span 326 approximates 75% of the original time span 335; the time span 336 approximates 62% of the original time span 335. Thus, while the pre-discharged type flip-flop demonstrates slightly slower response times than the pre-charged type flip-flop when the output signal falls from logical high to logical low, the disparity is significantly less than the improved comparative response times exhibited by that pre-discharged type flip-flop when the output signal rises from logical low to logical high.

Figure 4:
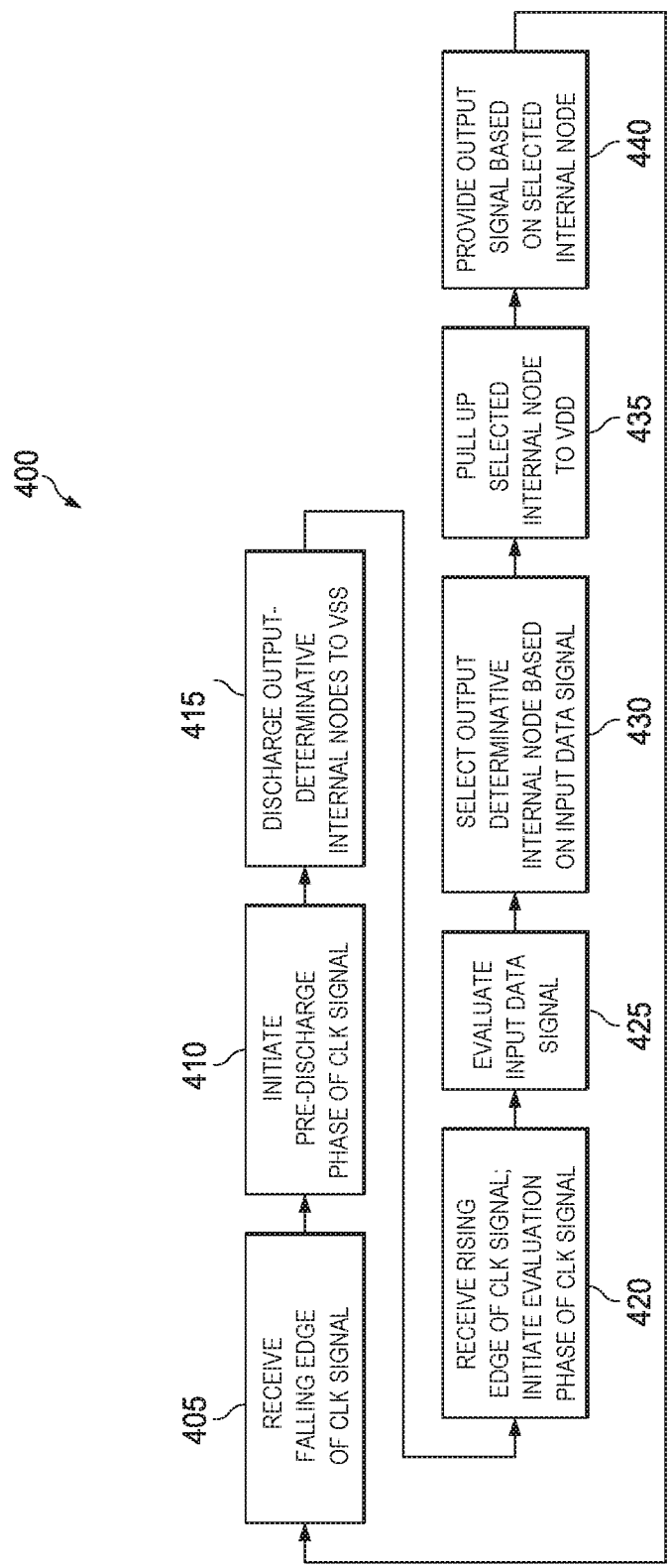
FIG. 4 is a flow diagram illustrating operations of a pre-discharged type flip-flop in accordance with some embodiments.

FIG. 4 is a flow diagram illustrating operations 400 of a pre-discharged type flip-flop in accordance with some embodiments. In particular, the operations 400 include operations performed by such a flip-flop in response to a provided clock signal, such as clock signal 101 of FIGS. 1-2.

In the depicted embodiment, at 405 a falling edge of the clock signal is received. At 410, a pre-discharge phase is initiated based on the receiving of the falling edge of the clock signal. At 415, output-determinative internal nodes of the flip-flop (such as nodes SL and RL of FIG. 2) are discharged to VSS (such as via, again with reference to the embodiment depicted in FIG. 2, transistors 241 and 242 of pre-discharge portion 140).

Continuing with the depicted embodiment of FIG. 4, at 420 a rising edge of the incoming clock signal is received, thereby initiating an evaluation phase of the clock signal. At 425, an input data signal (such as data input signal "D" 105 of FIGS. 1-2) is evaluated. At 430, one of the output-determinative internal nodes that were previously discharged to VSS is selected based on the value of that input data signal. At 435, the selected internal node is pulled up to VDD, and at 440 an output signal based on the logical state of that pulled up selected internal node is provided as the output of the flip-flop. Operations 400 then return to 405 for the next clock cycle.

As one exemplary embodiment, a flip-flop circuit includes a first input to receive a data input signal; a second input to receive a clock signal; a differential master latch circuit that operates in a pre-discharge mode during a first phase of the clock signal and in an evaluation mode during a second phase of the clock signal, where to operate in the pre-discharge mode includes to discharge a plurality of internal nodes of the differential master latch circuit, and where to operate in the evaluation mode includes to charge a selected one of the plurality of internal nodes based on a logical value of the data input signal; and a multiplexer having first and second inputs coupled to the differential master latch circuit, having an output for providing a data output signal, and having a third input coupled to the clock signal via a single inverter.

Implementations may include one or more of the following features: The flip-flop circuit indicated above, where, in operation, the flip-flop causes the data output signal to transition to a logical value of the data input signal in response to a rising edge of the clock signal. In operation, the flip-flop transitions to the evaluation mode in response to a rising edge of the clock signal. In operation, the flip-flop transitions to the pre-discharge mode in response to a falling edge of the clock signal. The first input of the multiplexer is coupled to a first one of the plurality of internal nodes of the differential master latch circuit and where the second input of the multiplexer is coupled to a distinct second one of the plurality of internal nodes of the differential master latch circuit. The flip-flop may include a slave latch circuit coupled to the differential master latch circuit and to an additional input of the multiplexer. The slave latch circuit is coupled to the additional input of the multiplexer via a latch node having a logical value that is complementary to the data output signal.

As another exemplary embodiment, a microprocessor may include one or more pre-discharged type flip-flops, at least one of the one or more pre-discharged type flip-flops including: a first input to receive a data input signal; a second input to receive a clock signal; a differential master latch circuit that operates in a pre-discharge mode during a first phase of the clock signal and in an evaluation mode during a second phase of the clock signal, where to operate in the pre-discharge mode includes to discharge a plurality of internal nodes of the differential master latch circuit, and where to operate in the evaluation mode includes to charge a selected one of the plurality of internal nodes based on a logical value of the data input signal; and a multiplexer having first and second inputs coupled to the differential master latch circuit, having an output for providing a data output signal, and having a third input coupled to the clock signal via a single inverter.

Implementations may include one or more of the following features: The microprocessor indicated above, where, in operation, at least one of the one or more pre-discharged type flip-flops causes the data output signal to transition to a logical value of the data input signal in response to a rising edge of the clock signal. In operation, at least one of the one or more pre-discharged type flip-flops transitions to the evaluation mode in response to a rising edge of the clock signal. In operation, at least one of the one or more pre-discharged type flip-flops transitions to the pre-discharge mode in response to a falling edge of the clock signal. For at least one of the one or more pre-discharged type flip-flops, the first input of the multiplexer is coupled to a first one of the plurality of internal nodes of the differential master latch circuit and where the second input of the multiplexer is coupled to a distinct second one of the plurality of internal nodes of the differential master latch circuit. At least one of the one or more pre-discharged type flip-flops further includes a slave latch circuit coupled to the differential master latch circuit and to an additional input of the multiplexer. The slave latch circuit is coupled to the additional input of the multiplexer via a latch node having a logical value that is complementary to the data output signal.

As still another exemplary embodiment, a method comprises receiving a data input signal via a first input of a flip-flop, the flip-flop including a differential master latch circuit and a multiplexer; receiving a clock signal via a second input of the flip-flop, the second input being coupled to the multiplexer via a single inverter; during a first phase of the clock signal, discharging multiple internal nodes of the differential master latch circuit; during a distinct second phase of the clock signal, charging a selected one of the multiple internal nodes to a logical high value; and during the distinct second phase of the clock signal and based on the selected one internal node, providing a data output signal representative of the data input signal.

Implementations may include one or more of the following features: The method indicated above, where providing the data output signal includes causing the data output signal to transition to a logical value of the data input signal in response to a rising edge of the clock signal. The method may include transitioning the flip-flop to the evaluation mode in response to a rising edge of the clock signal. The method may include transitioning the flip-flop to the pre-discharge mode in response to a falling edge of the clock signal.

In some embodiments, the apparatus and techniques described above are implemented in a system including one or more integrated circuit (IC) devices (also referred to as integrated circuit packages or microchips), such as devices including the pre-discharged edge-triggered flip-flop described above with reference to FIGS. 1 and 2A-2B. Electronic design automation (EDA) and computer aided design (CAD) software tools may be used in the design and fabrication of these IC devices. These design tools typically are represented as one or more software programs. The one or more software programs include code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above may implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A flip-flop comprising:
   a first input to receive a data input signal;
   a second input to receive a clock signal;
   a differential master latch circuit that operates in a pre-discharge mode during a first phase of the clock signal and in an evaluation mode during a second phase of the clock signal, wherein to operate in the pre-discharge mode includes to discharge a plurality of internal nodes of the differential master latch circuit, and wherein to operate in the evaluation mode includes to charge a selected one of the plurality of internal nodes based on a logical value of the data input signal; and
   a multiplexer having first and second inputs coupled to the differential master latch circuit, having an output for providing a data output signal, and having a third input coupled to the clock signal via a single inverter.

2. The flip-flop of claim 1 wherein, in operation, the flip-flop causes the data output signal to transition to a logical value of the data input signal in response to a rising edge of the clock signal.

3. The flip-flop of claim 1 wherein, in operation, the flip-flop transitions to the evaluation mode in response to a rising edge of the clock signal.

4. The flip-flop of claim 1 wherein, in operation, the flip-flop transitions to the pre-discharge mode in response to a falling edge of the clock signal.

5. The flip-flop of claim 1, wherein the first input of the multiplexer is coupled to a first one of the plurality of internal nodes of the differential master latch circuit and wherein the second input of the multiplexer is coupled to a distinct second one of the plurality of internal nodes of the differential master latch circuit.

6. The flip-flop of claim 1, further comprising a slave latch circuit coupled to the differential master latch circuit and to an additional input of the multiplexer.

7. The flip-flop of claim 6, wherein the slave latch circuit is coupled to the additional input of the multiplexer via a latch node having a logical value that is complementary to the data output signal.

8. A microprocessor, comprising:
   one or more pre-discharged type flip-flops, at least one of the one or more pre-discharged type flip-flops including:
   a first input to receive a data input signal;
   a second input to receive a clock signal;
   a differential master latch circuit that operates in a pre-discharge mode during a first phase of the clock signal and in an evaluation mode during a second phase of the clock signal, wherein to operate in the pre-discharge mode includes to discharge a plurality of internal nodes of the differential master latch circuit, and wherein to operate in the evaluation mode includes to charge a selected one of the plurality of internal nodes based on a logical value of the data input signal; and
   a multiplexer having first and second inputs coupled to the differential master latch circuit, having an output for providing a data output signal, and having a third input coupled to the clock signal via a single inverter.

9. The microprocessor of claim 8 wherein, in operation, at least one of the one or more pre-discharged type flip-flops causes the data output signal to transition to a logical value of the data input signal in response to a rising edge of the clock signal.

10. The microprocessor of claim 8 wherein, in operation, at least one of the one or more pre-discharged type flip-flops transitions to the evaluation mode in response to a rising edge of the clock signal.

11. The microprocessor of claim 8 wherein, in operation, at least one of the one or more pre-discharged type flip-flops transitions to the pre-discharge mode in response to a falling edge of the clock signal.

12. The microprocessor of claim 8, wherein for at least one of the one or more pre-discharged type flip-flops, the first input of the multiplexer is coupled to a first one of the plurality of internal nodes of the differential master latch circuit and wherein the second input of the multiplexer is coupled to a distinct second one of the plurality of internal nodes of the differential master latch circuit.

13. The microprocessor of claim 8, wherein at least one of the one or more pre-discharged type flip-flops further includes a slave latch circuit coupled to the differential master latch circuit and to an additional input of the multiplexer.

14. The microprocessor of claim 13, wherein the slave latch circuit is coupled to the additional input of the multiplexer via a latch node having a logical value that is complementary to the data output signal.

15. A method comprising:
   receiving a data input signal via a first input of a flip-flop, the flip-flop including a differential master latch circuit and a multiplexer;
   receiving a clock signal via a second input of the flip-flop, the second input being coupled to the multiplexer via a single inverter;
   during a first phase of the clock signal, discharging multiple internal nodes of the differential master latch circuit;
   during a distinct second phase of the clock signal, charging a selected one of the multiple internal nodes to a logical high value; and
   during the distinct second phase of the clock signal and based on the selected one internal node, providing a data output signal representative of the data input signal.

16. The method of claim 15 wherein providing the data output signal includes causing the data output signal to transition to a logical value of the data input signal in response to a rising edge of the clock signal.

17. The method of claim 15, further comprising transitioning the flip-flop to the evaluation mode in response to a rising edge of the clock signal.

18. The method of claim 15, further comprising transitioning the flip-flop to the pre-discharge mode in response to a falling edge of the clock signal.

* * * * *